United States Patent
Won (10) Patent No.: US 7,872,299 B2
(45) Date of Patent: Jan. 18, 2011

(54) NONVOLATILE MEMORY DEVICES AND METHODS OF FABRICATING THE SAME

(75) Inventor: Seok-Jun Won, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 256 days.

(21) Appl. No.: 12/081,160

(22) Filed: Apr. 11, 2008

(65) Prior Publication Data

US 2008/0283905 A1 Nov. 20, 2008

(30) Foreign Application Priority Data

May 18, 2007 (KR) ...................... 10-2007-0048845

(51) Int. Cl.
*H01L 27/115* (2006.01)
(52) U.S. Cl. ...................................... 257/326
(58) Field of Classification Search ................. 257/324, 257/325, E21.679, 618–628
See application file for complete search history.

(56) References Cited

U.S. PATENT DOCUMENTS

| | | | | |
|---|---|---|---|---|
| 5,291,048 | A * | 3/1994 | Nakao | 257/325 |
| 6,555,865 | B2 * | 4/2003 | Lee et al. | 257/314 |
| 7,217,972 | B2 * | 5/2007 | Mori | 257/315 |
| 2006/0205148 | A1 | 9/2006 | Deppe et al. | |

FOREIGN PATENT DOCUMENTS

| | | |
|---|---|---|
| JP | 2004-349705 | 12/2004 |
| KR | 10-2002-0092114 | 12/2002 |
| KR | 10-2004-0070804 | 8/2004 |
| KR | 10-0543209 | 1/2006 |
| KR | 1020060035551 | 4/2006 |
| KR | 10-0613288 | 8/2006 |
| KR | 10-0690925 | 2/2007 |
| KR | 10-2007-0028240 | 3/2007 |

OTHER PUBLICATIONS

English Language Abstract of KR 1020060079372 dated Jul. 6, 2006.
Notice of Allowance dated February 25, 2008 in corresponding Korean Patent Application No. 10-2007-0048845.

* cited by examiner

*Primary Examiner*—Marcos D Pizarro
*Assistant Examiner*—Sue Tang
(74) *Attorney, Agent, or Firm*—Harness, Dickey & Pierce, P.L.C.

(57) ABSTRACT

Provided are nonvolatile memory devices and methods of fabricating the same which may prevent or reduce deterioration of device characteristics and deterioration of a breakdown voltage. The nonvolatile memory device may include a semiconductor substrate, a charge-trap insulation layer on the semiconductor substrate and having a first region and second regions having a lower density of charge-trap sites than the first region, and a gate electrode on the charge-trap insulation layer, wherein the first region is overlapped by the gate electrode and the second regions are outside of the first region.

25 Claims, 7 Drawing Sheets

NONVOLATILE MEMORY DEVICES AND METHODS OF FABRICATING THE SAME

PRIORITY STATEMENT

This application claims priority under 35 U.S.C. §119 to Korean Patent Application No. 10-2007-0048845, filed on May 18, 2007, in the Korean Intellectual Property Office (KIPO), the entire contents of which are incorporated herein by reference.

BACKGROUND

1. Field

Example embodiments relate to nonvolatile memory devices and methods of fabricating the same. Other example embodiments relate to charge-trap nonvolatile memory devices and methods of fabricating the same.

2. Description of the Related Art

Nonvolatile memory devices may be used in various data communication devices, e.g., digital cameras, mobile phones, personal digital assistants (PDAs) and/or MPEG-3 (MP3) players because of their ability to maintain data stored therein even when power is not supplied.

Nonvolatile memory devices may be classified into floating-gate memory devices and charge-trap memory devices. A charge-trap memory device may include a charge-trap structure which has, for example, a tunnel layer, a charge-trap layer, and a blocking layer. A gate electrode may be disposed on a charge-trap structure, and spacers may be disposed on the sidewalls of the gate electrode.

At least part of a charge-trap structure may be patterned using a gate electrode or spacers as etching masks. However, when patterning a charge-trap structure using a gate electrode as an etching mask, the sidewalls of a blocking layer may create an undesirable flow of charge from the gate electrode to a charge-trap layer, thereby causing the breakdown voltage of the transistor to deteriorate. When patterning a charge-trap structure using spacers as etching masks, a charge-trap layer may protrude beyond the sidewalls of a gate electrode by as much as the thickness of the spacers. Charge may be injected into the charge-trap layer by the influence of the vertical electric field generated by the gate electrode. Then, the charge injected into the charge-trap layer may spread throughout the entire charge-trap layer. However, because charges in the portions of the charge-trap layer that protrude beyond the sidewalls of the gate electrode are not directly affected by the vertical electric-field of the gate electrode, charges may not be erased during an erase operation and remain in the portions of the charge-trap layer that protrude beyond the sidewalls of the gate electrode even after the erase operation. The charges remaining in the portions of the charge-trap layer that protrude beyond the sidewalls of the gate electrode may adversely affect the threshold voltage of a transistor and cause the characteristics of the entire nonvolatile memory device to deteriorate.

SUMMARY

Example embodiments provide nonvolatile memory devices which may prevent or reduce deterioration of device characteristics and deterioration of a breakdown voltage. Example embodiments also provide methods of fabricating a nonvolatile memory device which may prevent or reduce deterioration of device characteristics and deterioration of a breakdown voltage. However, example embodiments are not restricted to the ones set forth herein. Example embodiments will become apparent to one of daily skill in the art to which example embodiments pertain by referencing the detailed description of example embodiments given below.

According to example embodiments, a nonvolatile memory device may include a semiconductor substrate, a charge-trap insulation layer on the semiconductor substrate and including a first region and second regions having a lower density of charge-trap sites than the first region, and a gate electrode on the charge-trap insulation layer, wherein the gate electrode overlaps the first region and the second regions are outside of the first region.

According to example embodiments, a nonvolatile memory device may include a semiconductor substrate, a charge-trap insulation layer on the semiconductor substrate, a blocking layer on the charge-trap insulation layer, and a gate electrode on the blocking layer, wherein sidewalls of the blocking layer protrude beyond sidewalls of the gate electrode and sidewalls of the charge-trap insulation layer are between the sidewalls of the blocking layer and the sidewalls of the gate electrode.

According to example embodiments, a method of fabricating a nonvolatile memory device may include forming a charge-trap insulation layer on a semiconductor substrate, the charge-trap insulation layer including a first region and second regions having a lower density of charge-trap sites than the first region, and forming a gate electrode on the charge-trap insulation layer, wherein forming the charge-trap insulation layer includes overlapping the first region with the gate electrode and forming the second regions outside of the first region.

According to example embodiments, a method of fabricating a nonvolatile memory device may include forming a charge-trap insulation layer and a blocking insulation layer on a semiconductor substrate, forming a gate electrode on the blocking insulation layer, forming spacers on sidewalls of the gate electrode, exposing a portion of the charge-trap insulation layer by etching the blocking insulation layer using the gate electrode and the spacers as etching masks, and providing charge-trap-site elimination elements to the exposed portion of the charge-trap insulation layer.

BRIEF DESCRIPTION OF THE DRAWINGS

Example embodiments will be more clearly understood from the following detailed description taken in conjunction with the accompanying drawings. FIGS. 1-14 represent non-limiting, example embodiments as described herein.

FIGS. 9-13B are cross-sectional views for explaining a method of fabricating a nonvolatile memory device according to example embodiments.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein. Rather, these embodiments are provided so that this disclosure will be thorough and complete, and will fully convey the concept of example embodiments to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to limit example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Furthermore, relative terms such as "below," "beneath," or "lower," "above," and "upper" may be used herein to describe one element's relationship to another element as illustrated in the accompanying drawings. It will be understood that relative terms are intended to encompass different orientations of the device in addition to the orientation depicted in the accompanying drawings. For example, if the device in the accompanying drawings is turned over, elements described as being on the "lower" side of other elements would then be oriented on "upper" sides of the other elements. Similarly, if the device in one of the figures is turned over, elements described as "below" or "beneath" other elements would then be oriented "above" the other elements. Therefore, the exemplary terms "below" and "beneath" can, therefore, encompass both an orientation of above and below.

Example embodiments described herein with reference to cross-section illustrations that are schematic illustrations of idealized example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Figure 1:
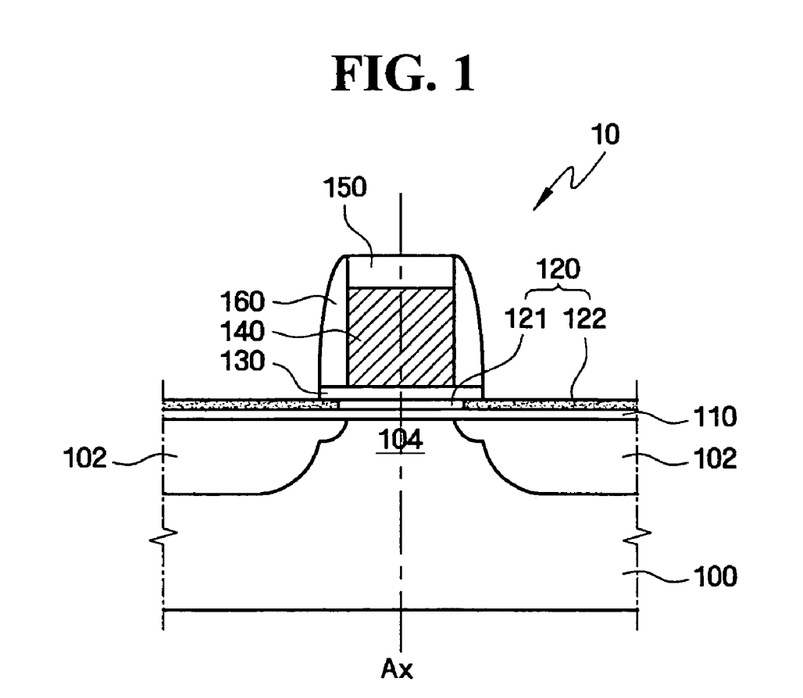
FIG. 1 is a cross-sectional view of a nonvolatile memory device according to example embodiments.
Figure 2:
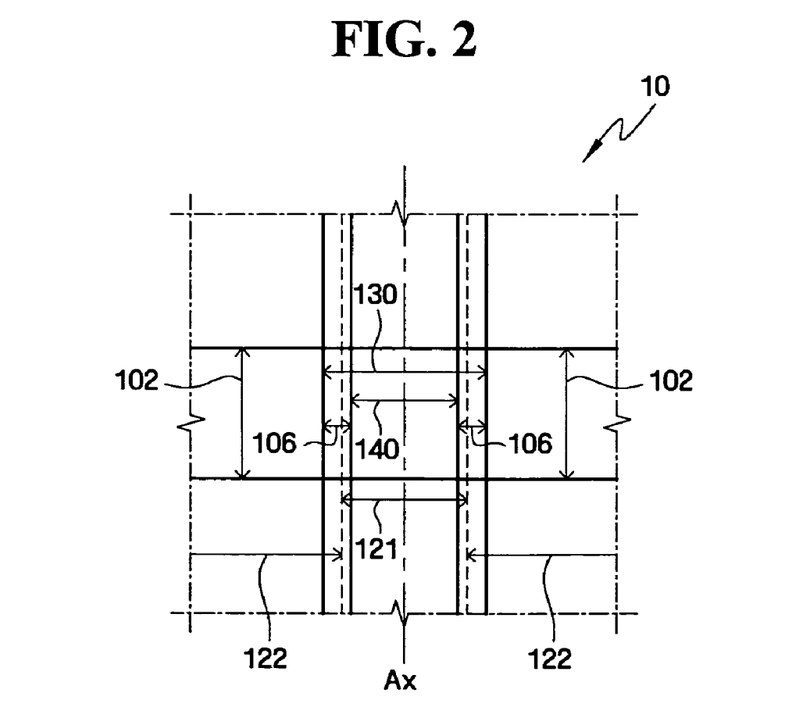
FIG. 2 is a layout of the nonvolatile memory device illustrated in FIG. 1.

FIG. 1 is a cross-sectional view of a nonvolatile memory device 10 according to example embodiments, and FIG. 2 is a layout of the nonvolatile memory device 10. Referring to FIGS. 1 and 2, the nonvolatile memory device 10 may include a semiconductor substrate 100, a charge-trap insulation layer 120 formed on the semiconductor substrate 100, and a gate electrode 140 formed on the charge-trap insulation layer 120. The semiconductor substrate 100 may be a substrate formed of one selected from Si, Ge, SiGe, GaP, GaAs, SiC, SiGeC, InAs and InP, or may be a silicon-on-insulator (SOI) substrate.

An isolation layer (not shown), e.g., a shallow trench isolation (STI) layer and/or a local-oxidation-of-silicon (LOCOS) layer, may be formed on the semiconductor substrate, thereby defining an active region. The active region may include a plurality of source/drain regions 102 which are doped with impurity ions and may be a predetermined or given distance apart from each other, and a channel region 104 between the source/drain regions 102. The gate electrode 140 may overlap the channel region 104. The gate electrode 140 may overlap the source/drain regions 102 or may not overlap the source/drain regions 102.

The conductivity type of impurity ions with which the source/drain regions 102 are doped may vary according to the type of transistor to which the source/drain regions 102 are applied. For example, if the source/drain regions 102 are applied to an NMOS transistor, the source/drain regions 102 may include n-type impurities, e.g., phosphor (P) and asbestos (As). In contrast, if the source/drain regions 102 are applied to a PMOS transistor, the source/drain regions 102 may include p-type impurities, e.g., boron (B).

The doping concentration of impurities may vary from one portion to another of the source/drain regions 102. For example, each of the source/drain regions 102 may include a low-concentration impurity region and a high-concentration impurity region. The low-concentration impurity regions may be disposed between the channel region 104 and the high-concentration impurity regions. The low-concentration impurity regions may be substantially aligned with the sidewalls of the gate electrode 140. If spacers 160 are formed on the sidewalls of the gate electrode 140, the high-concentration impurity regions may be substantially aligned with the outer sidewalls of the spacers 160.

The charge-trap insulation layer 120 may be formed on the semiconductor substrate 100. The charge-trap insulation layer 120 may be formed on the entire surface of the semiconductor substrate 100. The thickness of the charge-trap insulation layer 120 may be in the range of about 30 Å-about 100 Å. The charge-trap insulation layer 120 will be described later in further detail.

The gate electrode 140 may be formed on the charge-trap insulation layer 120. The gate electrode 140 may overlap the channel region 104 of the active region. The gate electrode 140 may extend, overlapping the active region, as illustrated in FIG. 2. If the gate electrode 140 is formed as a line and extends across the active region, the gate electrode 140 may be referred to as a wordline.

The gate electrode 140 may be formed of a polysilicon layer, a polysilicon layer with implanted impurities, a metallic layer, or a deposit layer including at least two selected from a polysilicon layer, a polysilicon layer with impurities implanted thereinto, and a metallic layer. If the gate electrode 140 includes a metallic layer, the metallic layer may include TaN, NiTa, Ti, TiN, Ta, W, WNx, Hf, Nb, Mo, RuOx, MoNx, Ir, Pt, Co, Cr, RuO, or a composite layer thereof. The thickness of the gate electrode 140 may be in the range of about 800 Å-about 2000 Å.

A hard mask 150, which has substantially the same pattern as the gate electrode 140, may be formed on the gate electrode 140. The hard mask 150 may include a silicon oxide layer, a silicon nitride layer, a silicon oxynitride layer and/or a polysilicon layer. The hard mask 150 may be removed or may not be formed at all, e.g., the hard mask 150 is optional.

The spacers 160 may be formed on the sidewalls of the gate electrode 140. The spacers 160 may have a typical spacer shape. The term "typical spacer shape," as used herein, denotes the shape of a spacer formed using a typical spacer operation (e.g., an etch-back operation). Specifically, a typical spacer has a curved outer surface so that the spacer may have a uniform width or become wider from the top to the bottom of the spacer. For example, the curvature radius of a typical spacer may be uniformly maintained or may gradually increase from the top to the bottom of the spacer. A typical spacer may have an infinite curvature radius which implies a substantially flat surface. The spacers 160 may include a silicon oxide layer, a silicon nitride layer and/or a silicon oxynitride layer.

At least part of the charge-trap insulation layer 120 may have the ability to capture charges. The charge-trap insulation layer 120 may be divided into at least two regions according to its ability to capture charges. For example, the charge-trap insulation layer 120 may include a first region 121 with an improved ability to capture charges, and second regions 122 which have a relatively weak ability to capture charges. One of the main factors in determining the ability of the charge-trap insulation layer 120 to trap charges is the density of charge-trap sites. Charge-trap sites are sites that may capture charges and substantially contribute to the storage of data. The higher the density of charge-trap sites, the better the ability of the charge-trap insulation layer 120 to trap charges.

Charge-trap sites are closely related to dangling bonds in the charge-trap insulation layer 120. For example, if the charge-trap insulation layer 120 includes silicon (e.g., a silicon nitride layer), the density of charge-trap sites may increase in proportion to the number of silicon dangling bonds in the charge-trap insulation layer 120.

The number of silicon dangling bonds may vary from one silicon nitride layer to another according to the density of silicon atoms. For example, the number of silicon dangling bonds may be substantially proportional to the density of silicon atoms. Even if the density of silicon atoms in a silicon nitride layer is relatively high, the number of silicon dangling bonds that do not combine with other atoms may increase according to the silicon content of an insulation layer. In short, the number of silicon dangling bonds in an insulation layer (i.e., the density of charge-trap sites) may be proportional to the density of silicon atoms in the insulation layer and the content of silicon atoms in the insulation layer.

Therefore, assuming that the first region 121 and the second regions 122 have the same density of silicon atoms, the silicon content of the first region 121, which has a relatively high density of charge-trap sites, may be greater than the silicon content of the second regions 122, which have a relatively low density of charge-trap sites. For example, if the first region 121 includes $Si_xN_y$ (where $x+y=1$, $x>0$, and $y>0$) and the second regions 122 include $Si_{x'}N_{y'}$ (where $x'+y'=1$), the first region 121 and the second regions 122 may satisfy the following equations: $x>x'$; and $y<y'$. The ratio (i.e., x:y) of the silicon content (x) of the first region 121 and the nitrogen content (y) of the first region 121 may be different from the ratio (i.e., x':y') of the silicon content (x') of the second regions 122 and the nitrogen content (y') of the second regions 122. Because the number of nitrogen atoms that combine with silicon atoms is greater in the second regions 122 than in the first region 121, the number of silicon dangling bonds may be smaller in the second regions 122 than in the first region 121, and, thus, the density of charge-trap sites may be lower in the second regions 122 than in the first region 121. In order for the first region 121 to have a sufficiently high density of charge-trap sites, the first region 121 may be silicon-rich, e.g., $x>y$.

Silicon atoms may combine with various atoms other than nitrogen atoms. For example, silicon atoms may combine with oxygen (O) or hydrogen (H) atoms. Therefore, oxygen and hydrogen atoms in the charge-trap insulation layer 120 may affect the density of charge-trap sites. For example, assuming that the density of silicon atoms is relatively uniform throughout the entire charge-trap insulation layer 120, and that the charge-trap insulation layer 120 also includes oxygen and/or hydrogen, the material of the first region 121 may be represented by $Si_xN_yO_zH_w$ (where $x+y+z+w=1$, $x>0$, $y>0$, $z\geqq0$, and $w\geqq0$), and the material of the second regions 122 may be represented by $Si_{x'}N_{y'}O_{z'}H_{w'}$ (where $x'+y'+z'+w'=1$, $x>0$, $y>0$, $z'\geqq0$, and $w'\geqq0$). In order for the first region 121 to have a higher density of charge-trap sites than the second regions 122, the silicon content (x) of the first region 121 may be greater than the silicon content (x') of the second regions 122, e.g., the first region 121 and the second regions 122 may satisfy the equation: $x>x'$. At least one of the oxygen content (z) and the hydrogen content (w) of the first region 121 may be 0, and at least one of the oxygen content (z') and the hydrogen content (w') of the second regions 122 may be greater than 0. For example, the first region 121 may not include oxygen and/or hydrogen, whereas the second regions 122 may include oxygen and/or hydrogen.

Even if the first region 121 and the second regions 122 have the same silicon density, the same nitrogen density, and the same silicon content-to-nitrogen content ratio (x:y and x':y'), the first region 121 may have a different charge-trap site density from that of the second regions 122 according to the content of oxygen and hydrogen. For example, even if the density of silicon atoms, the density of nitrogen atoms, and the ratio of the content of silicon and nitrogen in the charge-trap insulation layer 120 are uniform throughout the entire charge-trap insulation layer 120, the charge-trap site density of the second regions 122 may be reduced below the charge-trap site density of the first region 121 by selectively implanting oxygen and/or hydrogen atoms into the second regions 122. The charge-trap site density of the second regions 122 may also be reduced below the charge-trap site density of the first region 121 by selectively implanting nitrogen atoms, instead of oxygen and/or hydrogen atoms, into the second regions 122 or by selectively implanting nitrogen atoms as well as oxygen and/or hydrogen atoms into the second regions 122.

The charge-trap site density of the first region 121 may be adjusted to be sufficiently high, and the charge-trap site density of the second regions 122 may be adjusted to be sufficiently low. As a result, the first region 121 may serve as a charge trap capable of storing data by trapping charges, whereas the second regions 122 may become irrelevant to the storage of data.

The first region 121 may actually serve as a charge-trap layer, and may thus be disposed at a similar location to that of a charge-trap layer of a conventional nonvolatile memory device. For example, a majority of the first region 121, which has a relatively high density of charge-trap sites, may be overlapped by the gate electrode 140 and the channel region 104. In contrast, the second regions 122, which have a relatively low density of charge-trap sites, may be on the ends of the first region 121. The first region 121 may be below the gate electrode 140 (or on a central portion of the channel region 104), and the second regions 122 may surround the first region 122. Therefore, the first region 121 may include at least a central axis (AX) of the gate electrode 140, and may be overlapped by the gate electrode 140. If the gate electrode 140 extends in a certain direction, as illustrated in FIG. 2, the first region 121 may also extend in the certain direction along with the gate electrode 140.

Each of the boundaries between the first region 121 and the second regions 122 may be a predetermined or given distance apart from the central axis AX of the gate electrode 140. Specifically, the boundaries between the first region 121 and the second regions 122 may be aligned with the outer sidewalls of the spacers 160 or may be disposed inside the limits of the outer sidewalls of the spacers 160 toward the central axis AX of the gate electrode 140. As described above, the first region 121 may actually serve as a charge-trap layer and the second regions 122 may be irrelevant to the trapping of charges. If the boundaries between the first region 121 and the second regions 122 are disposed inside the limits of the outer sidewalls of the spacers 160, the first region 121 may be deemed as having substantially the same structure as a charge-trap layer recessed from the outer sidewalls of the spacers 160 toward the central axis AX of the gate electrode 140, at least from a charge trapping view. For the same gate line widths, the closer the boundaries between the first region 121 and the second regions 122 are disposed near the central axis AX of the gate electrode 140, the smaller the width of the first region 121 may become.

The boundaries between the first region 121 and the second regions 122 may be disposed outside of the sidewalls of the gate electrode 140, may be aligned with the sidewalls of the gate electrode 140, or may be disposed inside of the sidewalls of the gate electrode 140. The degree of lateral charge spreading in the first region 121 may vary according to the locations of the boundaries between the first region 121 and the second regions 122 relative to the sidewalls of the gate electrode 140.

During a write operation performed by the nonvolatile memory device 10, charges may be injected into the charge-trap insulation layer 120 due to being influenced by a vertical electric field generated by the gate electrode 140. For example, if the boundaries between the first region 121 and the second regions 122 are disposed outside of the sidewalls of the gate electrode 140 from the central axis AX of the gate electrode 140, a majority of the charge may be injected into portions of the first region 121 overlapped by the gate electrode 140 during the write operation. Once charge is injected into the first region 121, the charges may spread throughout the entire first region 121 which has the same energy level, instead of being confined in the portions of the overlapped region by the gate electrode 140. As a result, after the write operation, charges may be disposed even in portions of the first region 121 that protrude beyond the sidewalls of the gate electrode 140.

However, because the portions of the first region 121 that protrude beyond the sidewalls of the gate electrode 140 are not directly affected by the vertical electric field of the gate electrode 140, the charges in the portions of the first region 121 that protrude beyond the sidewalls of the gate electrode 140 may not be erased even when a voltage is applied to the gate electrode 140 for performing an erase operation. The charges may thus remain in the portions of the first region 121 that protrude beyond the sidewalls of the gate electrode 140 even after the erase operation. The charges remaining in the portions of the first region 121 that protrude beyond the sidewalls of the gate electrode 140 may adversely affect a threshold voltage of a transistor, thereby deteriorating the device characteristics of the nonvolatile memory device 10. This phenomenon may become more severe as the degree to which the firs region 121 protrudes beyond the sidewalls of the gate electrode 140 increases.

In order to reduce the lateral spread of charge, the first region 121 may protrude as little as possible beyond the sidewalls of the gate electrode 140. Therefore, if the boundaries between the first region 121 and the second regions 122 are aligned with the outer sidewalls of the spacers 160 or disposed inside of the outer sidewalls of the spacers 160, an excessive lateral spread of charges may be prevented or reduced. In addition, if the boundaries between the first region 121 and the second regions 122 are aligned with the sidewalls of the gate electrode 140 or disposed inside of the sidewalls of the gate electrode 140, an excessive lateral spread of charges may be further prevented or reduced.

However, if the boundaries between the first region 121 and the second regions 122 are disposed inside of the sidewalls of the gate electrode 140 by a larger margin, the width of the first region 121 may decrease to an undesirable level, thereby reducing the charge storage capacity of the first region 121. Therefore, the boundaries between the first region 121 and the second regions 122 may be appropriately disposed so that a relatively excessive lateral spread of charges may be prevented or reduced, and that the first region 121 may store a relatively considerable amount of charge. For example, the boundaries between the first region 121 and the second regions 122 may be disposed between the gate electrode 140 and the outer sidewalls of the spacers 160. However, example embodiments may not be restricted to this.

The first region 121 and the second regions 122 may be distinguished from each other by their materials or compositions, rather than by physical patterning. Therefore, the boundaries between the first region 121 and the second regions 122 may not be damaged by physical patterning. Thus, deterioration of the electrical properties of the first region 121 may be prevented or reduced, which actually serves as a charge-trap layer. In addition, because the charge-trap insulation layer 120 extends beyond the gate electrode 140 and thus covers the entire surface of the semiconductor substrate 100, the underlying structure, e.g., a tunnel layer 110 and the source/drain regions 102, may be prevented or reduced from being exposed to an etching process and thus may protect the electrical characteristics of the underlying structure.

Referring to FIGS. 1 and 2, a blocking layer 130 may be interposed between the charge-trap insulation layer 120 and the gate electrode 140, and the tunnel layer 110 may be interposed between the charge-trap insulation layer 120 and the semiconductor substrate 100.

For example, the blocking layer 130 may be formed on the first region 121 of the charge-trap insulation layer 120, and may prevent or reduce charges trapped in the first region 121 from spreading into the gate electrode 140. The blocking layer 130 may include, for example, a silicon oxide layer. Alternatively, the blocking layer 130 may include a high-k layer, a double layer of a high-k layer and a silicon oxide layer, or a triple layer of a silicon oxide layer, a high-k layer and a silicon oxide layer. The high-k layer may be metal oxide or metal oxinitride of Group III or Group VB atoms. The disclosure of U.S. Patent Application No. 2004/0169238 (particularly regarding the material of the blocking layer 130) is incorporated herein by reference in its entirety. The thickness of the blocking layer 130 may be in the range of about 50 Å-about 250 Å.

The blocking layer 130, unlike the charge-trap insulation layer 120, may not be formed on the entire surface of the semiconductor substrate 100, and may be patterned so that the sidewalls of the blocking layer 130 may be disposed between the outer sidewalls of the spacers 160 and the sidewalls of the gate electrode 140.

The patterning of the blocking layer 130 may result in a defect in the blocking layer 130. For example, if the blocking layer 130 is formed of metal oxide, e.g., AlO, a conductive polymer may be formed on the sidewalls of the blocking layer 130 during the patterning of the blocking layer 130. The conductive polymer may create an undesirable path of movement of electrons from the gate electrode 140 to the first region 121 of the charge-trap insulation layer 120, thereby deteriorating a breakdown voltage. In order to address this, the sidewalls of the blocking layer 130 may be disposed outside of the sidewalls of the gate electrode 140. Specifically, as the sidewalls of the blocking layer 130 become more distant from the gate electrode 140, the blocking layer 130 may become less influenced by an electric field of the gate electrode 140. Then, use of a conductive polymer on the sidewalls of the blocking layer 130 may prevent or reduce flow of electrons.

The degree to which the blocking layer 130 protrudes beyond the sidewalls of the gate electrode 140 may affect the formation of the first region 121 of the charge-trap insulation layer 120. For example, the second regions 122 may be formed by implanting charge-trap-site elimination elements, e.g., nitrogen, oxygen and/or hydrogen, into the charge-trap insulation layer 120. The blocking layer 130 may be used as an implantation mask during the formation of the second regions 122. Therefore, portions of the charge-trap insulation layer 120, which are not covered by the blocking layer 130, may be transformed into the second regions 122. In addition, the charge-trap-site elimination elements implanted into the charge-trap insulation layer 120 may diffuse toward the central axis AX of the gate electrode 140, and thus, the second regions 122 may extend along the direction of the central axis AX of the gate electrode 140. Portions of the charge-trap insulation layer 120 having no charge-trap-site elimination elements may be transformed into the first region 121.

The locations of the boundaries between the first region 121 and the second regions 122 may vary according to the degree in which the blocking layer 130 covers the charge-trap insulation layer 120 and the degree in which charge-trap-site elimination elements implanted in the charge-trap insulation layer 120 diffuse. For example, if the blocking layer 130 protrudes much beyond the sidewalls of the gate electrode 140, and thus covers much of the charge-trap insulation layer 120, the boundaries between the first region 121 and the second regions 122 may become more distant from the central axis AX of the gate electrode 140. For example, if the blocking layer 130 protrudes much beyond the outer sidewalls of the spacers 160, the boundaries between the first region 121 and the second regions 122 may be distant from the sidewalls of the gate electrode 140 and may thus be disposed outside of even the outer sidewalls of the spacers 160. In this case where the boundaries between the first region 121 and the second regions 122 are distant from sidewalls of the gate electrode 140, the area in which charges may spread out may increase, and, thus, the device characteristics of the nonvolatile memory device 10 may deteriorate.

Because there is a tradeoff between the prevention or reduction of deterioration of breakdown voltage, and the prevention or reduction of the lateral spread of charges, the degree to which the blocking layer 130 protrudes beyond the gate electrode 140 may be appropriately determined considering the tradeoff relationship between the prevention or reduction of deterioration of a breakdown voltage and the prevention or reduction of the lateral spread of charges. For example, the sidewalls of the blocking layer 130 may be aligned with the outer sidewalls of the spacers 160. The blocking layer 130 may be patterned using the spacers 160 as etching masks, thereby simplifying the manufacture of the nonvolatile memory device 10.

Figure 3:
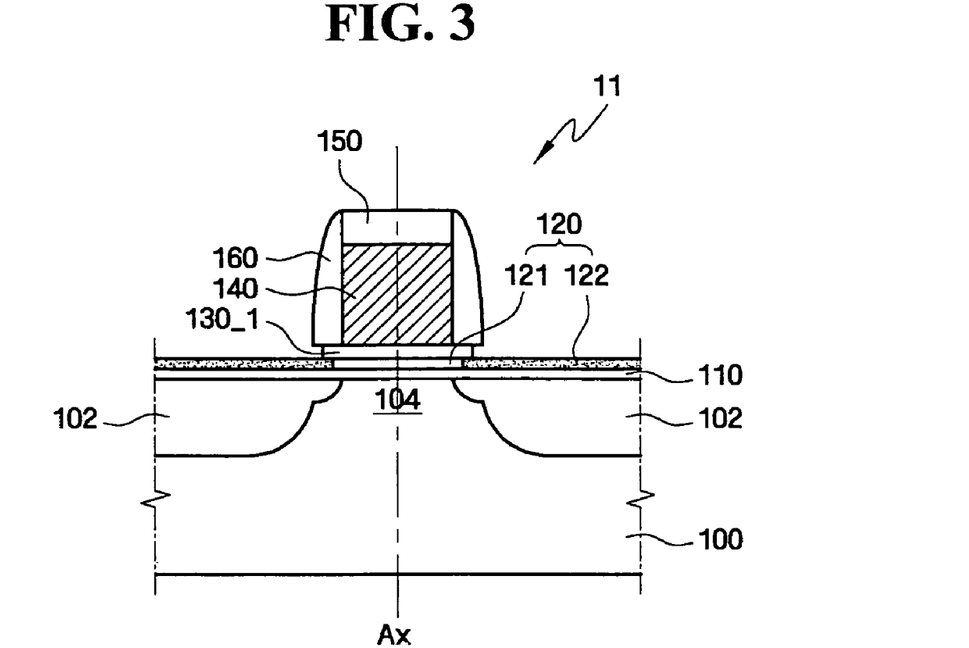
FIGS. 3-8 are cross-sectional views of nonvolatile memory devices according to example embodiments.

In situations when the problem of deterioration of a breakdown voltage does not arise, or arises only to an insignificant extent, a blocking layer 130_1 may be recessed in order to further prevent or reduce the lateral spread of charges. As a result, the sidewalls of the blocking layer 130_1 may be disposed inside of the outer sidewalls of the spacers 160 toward the central axis AX of the gate electrode 140, as illustrated in FIG. 3. If the blocking layer 130_1 is recessed inside of the outer sidewalls of the spacers 160, the area of the charge-trap insulation layer 120 exposed by the blocking layer 130_1 may increase. Thus, the boundaries between the first region 121 and the second regions may become close to the central axis AX of the gate electrode 140, and may thus become suitable for preventing or reducing the lateral spread of charges.

Referring to FIGS. 1 and 2, the tunnel layer 110 may electrically insulate the semiconductor substrate 100 from the charge-trap insulation layer 120. Also, the tunnel layer 110 may invert the channel region 104 of the semiconductor substrate 100 by coupling a voltage applied by the gate electrode 140 to the channel region 104. Also, the tunnel layer 110 may serve as a path of movement of electrons when electrons are implanted to the first region 121 of the charge-trap insulation layer 120, or when electrons are removed from the first region 121 of the charge-trap insulation layer 120. The tunnel layer 110 may be formed on the entire surface of the semiconductor substrate 100, as illustrated in FIG. 1. Alternatively, the tunnel layer 110 may be patterned so that the tunnel layer 110 may be aligned with the sidewalls of the gate electrode 140.

The tunnel layer 110 may be formed of, for example, silicon oxide, silicon oxynitride and/or a multi-layered film of silicon oxide and silicon oxynitride. The tunnel layer 110 may include a triple layer of a silicon oxide layer, a silicon nitride layer and a silicon oxide layer. The thickness of the tunnel layer 110 may be in the range of about 20 Å-about 100 Å.

FIGS. 4-8 are cross-sectional views of nonvolatile memory devices 12, 13, 14, 15, and 16, respectively, according to example embodiments. In FIGS. 1-8, like reference numerals represent like elements, and thus, detailed descriptions thereof will be skipped. The nonvolatile memory devices 12, 13, 14, 15, and 16 will hereinafter be described in detail, focusing mainly on the differences with the nonvolatile memory device 10 illustrated in FIGS. 1 and 2 and the nonvolatile memory device illustrated in FIG. 3.

Figure 4:
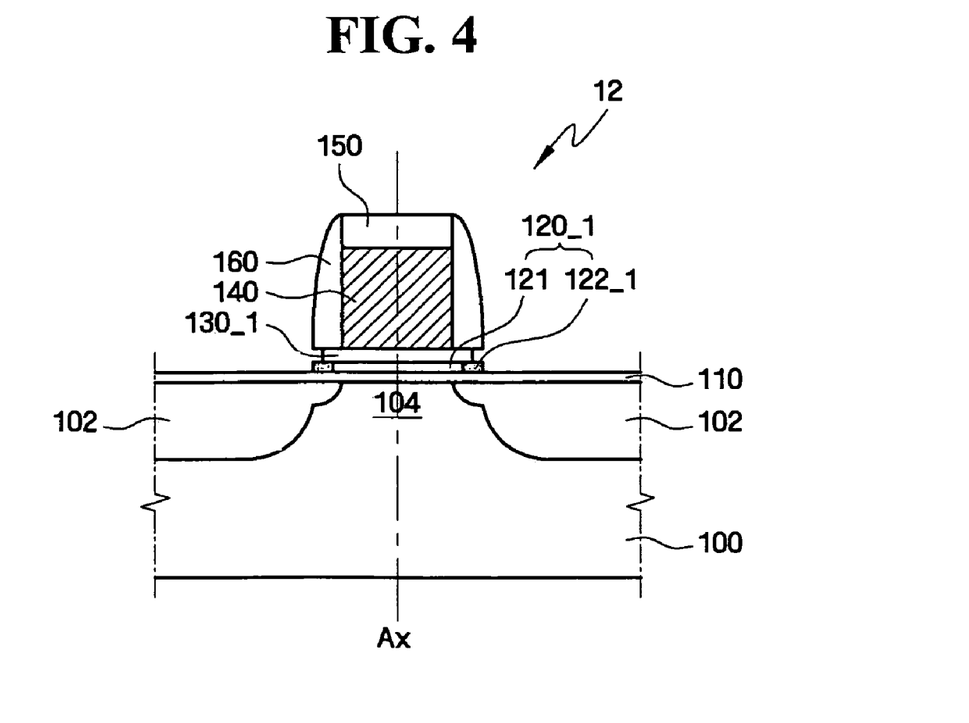

Referring to the nonvolatile memory device 12 illustrated in FIG. 4, a charge-trap insulation layer 120_1, unlike the charge-trap insulation layer 120 illustrated in FIG. 1, may not be formed on the entire surface of a semiconductor substrate 100. Instead, the charge-trap insulation layer 120_1 may be patterned so that the sidewalls of the charge-trap insulation layer 120_1 may be aligned with the outer sidewalls of spacers 160. The sidewalls of the charge-trap insulation layer 120_1 may become the outer sidewalls of second regions 122_1. The blocking layer 130_1 is illustrated in FIG. 4 as being recessed from the outer sidewalls of the spacers 160, as illustrated in FIG. 3. However, the blocking layer 130_1 may also be aligned with the outer sidewalls of the spacers 160.

Figure 5:
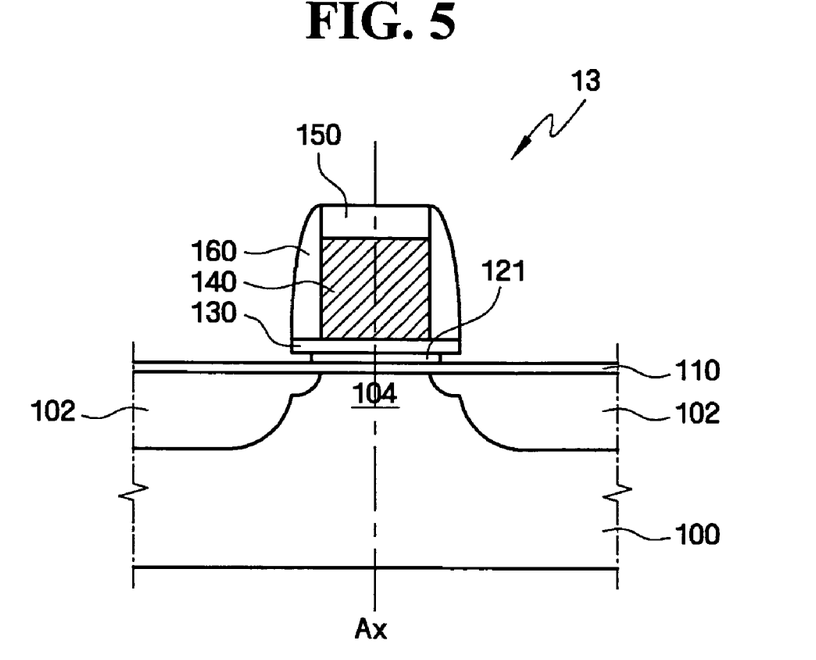

FIG. 5 illustrates a nonvolatile memory device 13 which is almost the same as that obtained by removing the second regions 122 and the remainder of the first region 121 of the charge-trap insulation layer 120 from the nonvolatile memory device 10 illustrated in FIG. 1. Because the second regions 122 do not affect the operating characteristics of a nonvolatile memory device, the nonvolatile memory device 13 may have substantially the same operating characteristics as the nonvolatile memory device 10.

Figure 6:
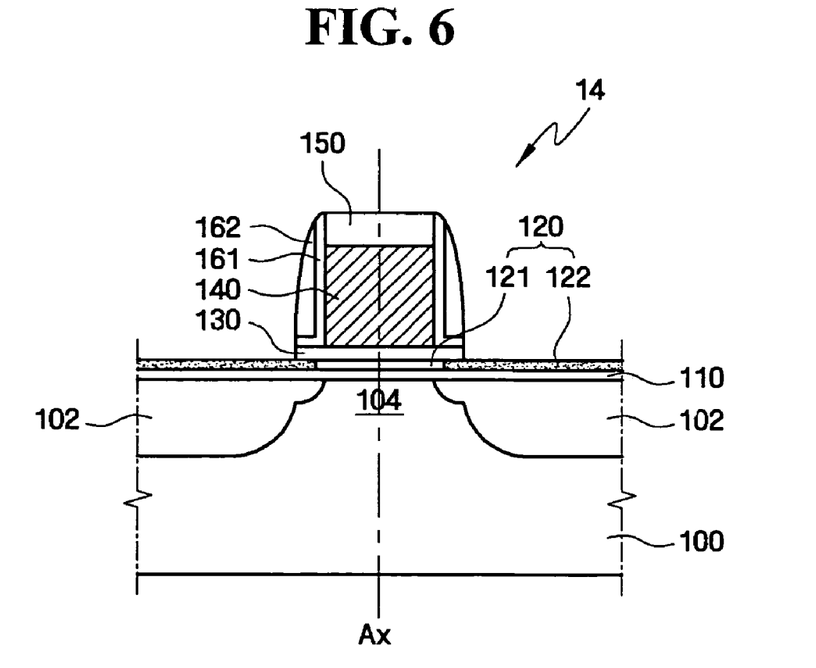
Figure 7:
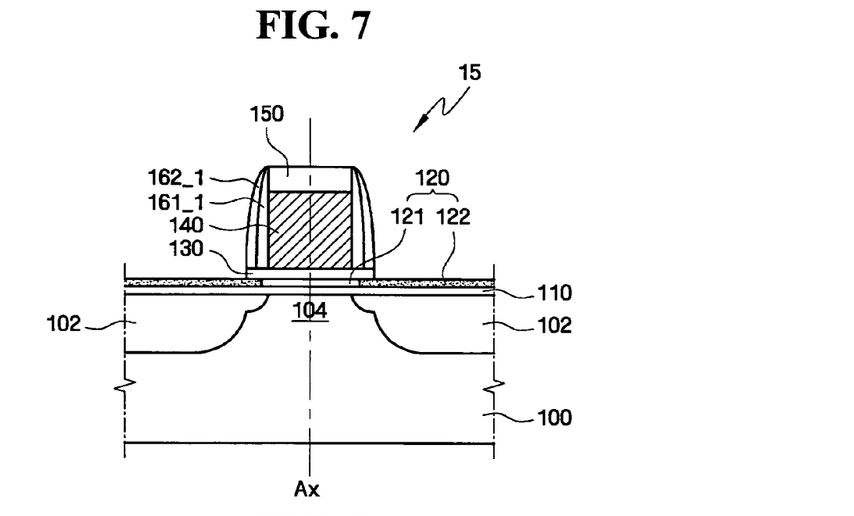

FIGS. 6 and 7 illustrate various shapes of spacers that may be employed in example embodiments. Referring to FIGS. 6 and 7, nonvolatile memory devices 14 and 15 may be different from the nonvolatile memory device 10 illustrated in FIG. 1 in that the nonvolatile memory devices 14 an 15 may include first spacers 161 and 161_1, respectively, and second spacers 162 and 162_1, respectively. Referring to FIG. 6, the first spacers 161 are L-shaped, and the second spacers 162 may have a typical spacer shape. Referring to FIG. 7, the first spacers 161_1 and the second spacers 162_2 may all have the typical spacer shape. Each of the first spacers 161 and 161_1 and the second spacers 162 and 162_2 may include a silicon oxide layer, a silicon nitride layer, or a silicon oxynitride layer. The first spacers 161 may be formed of a material having different etch selectivity from that of the second spacers 162. Likewise, the first spacers 161_1 may be formed of a material having different etch selectivity from that of the second spacers 162_1.

Figure 8:
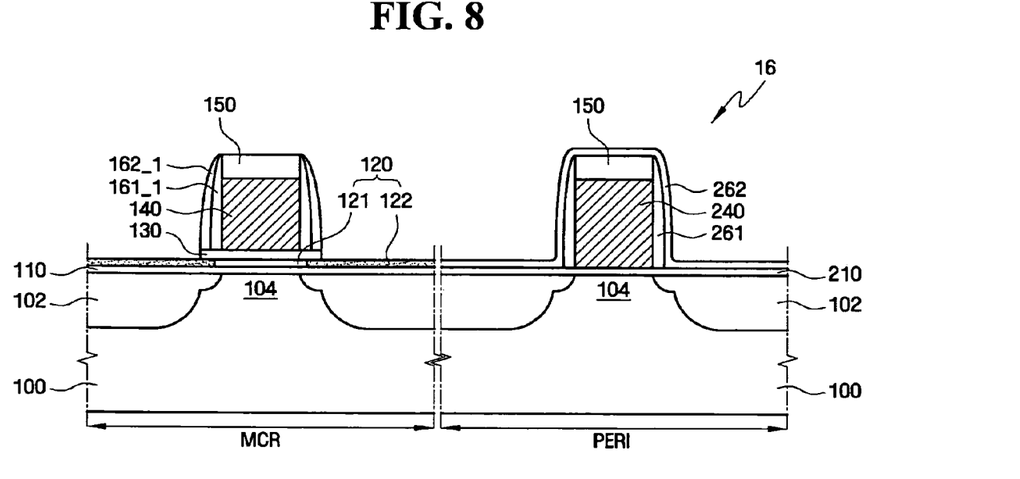

A nonvolatile memory device according to example embodiments may include a memory cell region and a peripheral circuit region. The memory cell region may have the same structure as one of those illustrated in FIGS. 1 and 3-7. FIG. 8 illustrates a nonvolatile memory device 16 according to example embodiments. Referring to FIG. 8, the nonvolatile memory device 16 may include a memory cell region MCR and a peripheral circuit region PERI. The memory cell region MCR may have the same structure as that illustrated in FIG. 7.

The peripheral circuit region PERI, unlike the memory cell region MCR, may not include a charge-trap insulation layer for trapping charges. Because the peripheral circuit region PERI has no charge-trap insulation layer, the peripheral circuit region PERI may not need to include a blocking layer. Instead, the peripheral circuit region PERI may include a gate insulation layer 210 which is interposed between a gate electrode 240 and a semiconductor substrate 100. The gate insulation layer 210 may be formed of the same material as that of the tunnel layer 110, and may have the same thickness as that of the tunnel layer 110. However, the material and the thickness of the gate insulation layer 210 may be altered according to the transistor characteristics required.

Referring to the memory cell region MCR, first spacers 161_1 may be formed on the sidewalls of a gate electrode, and second spacers 162_1 may be formed on the first spacers 161_1. In contrast, referring to the peripheral circuit region PERI, only first spacers 261 may be formed on the sidewalls of a gate electrode 240. The peripheral circuit region PERI, unlike the memory cell region MCR, may also include a cover layer 262 which covers the entire surface of the semiconductor substrate, including the gate electrode 240 and the first spacers 261. The gate insulation layer 210 may be protected by the cover layer 262, and thus, the swelling of the gate insulation layer 210 near the sidewalls of the gate electrode 240, commonly known as the "bird's beak" phenomenon, may be prevented or reduced. The cover layer 262 may be formed of the same material as that of the second spacers 162_1 for the purpose of simplifying the manufacture.

A method of fabricating a nonvolatile memory device according to example embodiments will hereinafter be described in detail. FIGS. 9-13B are cross-sectional views for explaining a method of fabricating a nonvolatile memory device according to example embodiments. An active region (not shown) may be defined by forming an isolation region in a semiconductor substrate 100 using, for example, a typical isolation method, e.g., the STI or LOCOS method.

Figure 9:
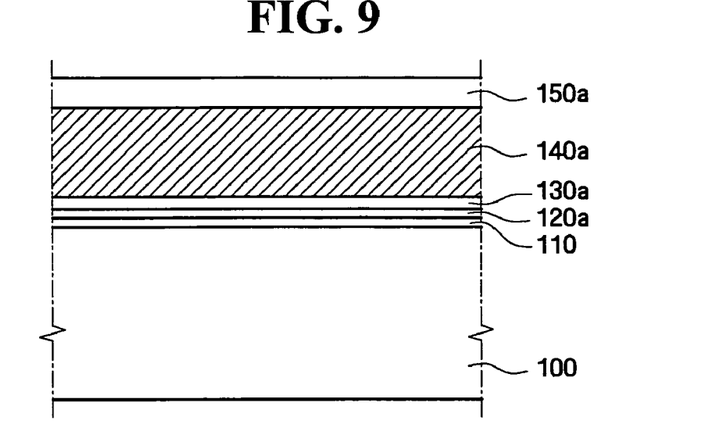

Thereafter, referring to FIG. 9, a tunnel layer 110, a charge-trap insulation layer 120a, and a blocking insulation layer 130a may be sequentially formed on the semiconductor substrate 100. The tunnel layer 110 may be formed using, for example, a furnace process and/or a thermal oxidation process that involves a rapid thermal process (RTP) and/or a deposition process, e.g., chemical vapor deposition (CVD), low pressure CVD (LPCVD) and/or plasma enhanced CVD (PECVD). The charge-trap insulation layer 120 and the blocking insulation layer 130a may both be formed using CVD, LPCVD and/or PECVD. However, example embodiments may not be restricted. For example, the tunnel layer 110, the charge-trap insulation layer 120a and the blocking insulation layer 130 may be formed using various methods other than those set forth herein.

Thereafter, a gate electrode conductive layer 140a and a hard mask layer 150a may be formed on the blocking insulation layer 130a. The gate electrode conductive layer 140a may be formed using CVD, LPCVD, physical vapor deposition (PVD), atomic layer deposition (ALD) and/or metal organic CVD (MOCVD). The hard mask layer 150a may be formed using CVD, LPCVD and/or PECVD.

Figure 10:
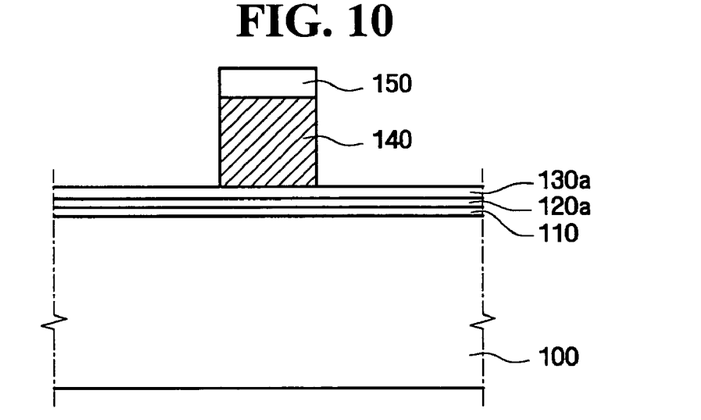

Referring to FIG. 10, a hard mask 150 and a gate electrode 140 may be formed by patterning the hard mask layer 150a and the gate electrode conductive layer 140a. Specifically, the hard mask 150 may be formed by patterning the hard mask layer 150a using photolithography that involves the use of photoresist. The gate electrode 140 may be formed by patterning the gate electrode conductive layer 140a using photoresist (not shown) and/or the hard mask 150 as an etching mask. In order to pattern the hard mask layer 150a and the gate electrode conductive layer 140a with precision, the etching of the hard mask layer 150a and the gate electrode conductive layer 140a may be performed using an anisotropic etching method. Examples of the anisotropic etching method include a dry etching method.

Figure 11:
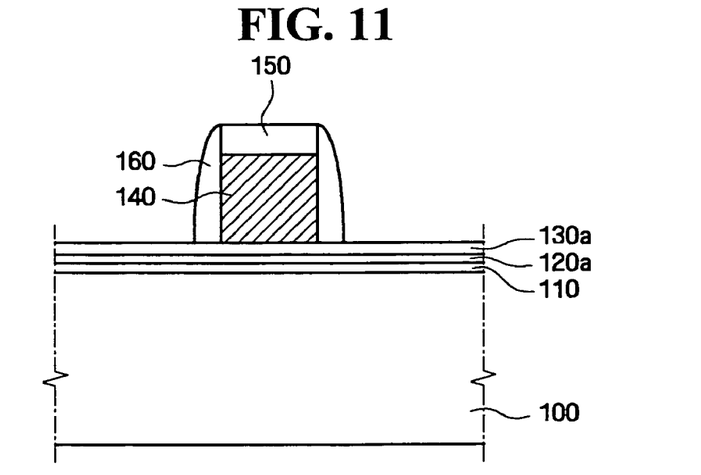

Referring to FIG. 11, spacers 160 may be formed on the sidewalls of the gate electrode 140. The spacers 160 may be formed using a conventional method. For example, the spacers 160 may be formed by forming a spacer layer on the entire surface of a structure illustrated in FIG. 10 and performing an etch-back operation.

Figure 12:
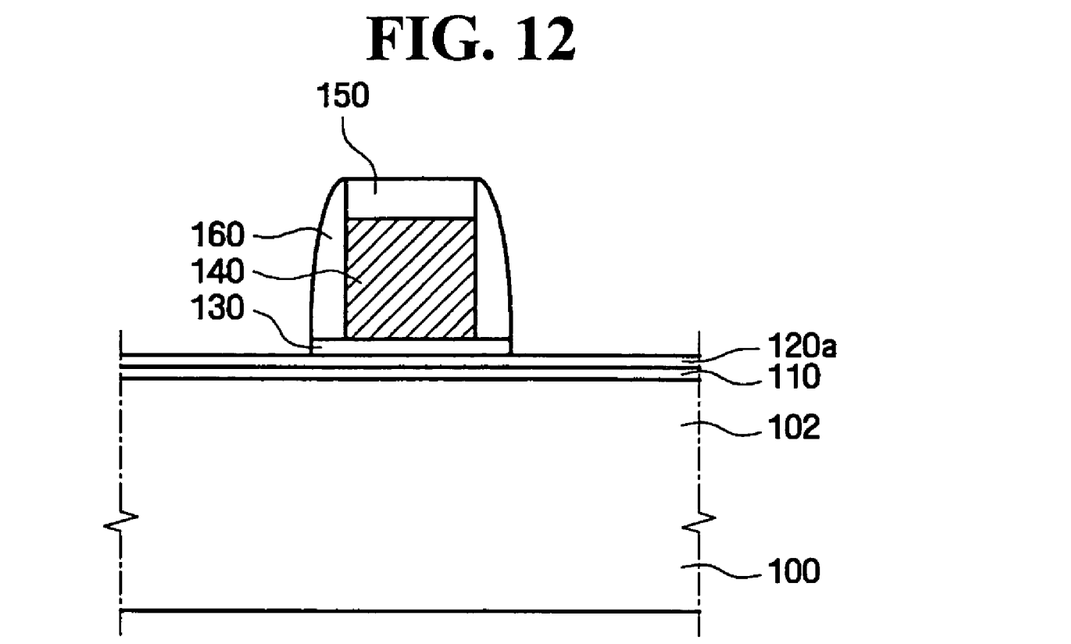

Referring to FIG. 12, the blocking insulation layer 130a may be etched using the gate electrode 140 and the spacers 160 as etching masks. The etching of the blocking insulation layer 130a may be performed using a dry etching method. As a result of the etching of the blocking insulation layer 130a, a blocking layer 130 may be formed, and portions of the charge-trap insulation layer 120a that are not covered by the blocking layer 130 may be exposed. The sidewalls of the blocking layer 130 may be aligned with the outer sidewalls of the spacers 160. Thereafter, the charge-trap insulation layer 120a may be divided into a first region and second regions having a relatively low density of charge-trap sites, and this will hereinafter be described in further detail with reference to FIGS. 13A and 13B.

Charge-trap-site elimination elements are provided to a structure illustrated in FIG. 12. Specifically, a primary thermal process may be performed on the structure illustrated in FIG. 12 at a temperature in the range of about 300° C.-about 800° C. in an atmosphere of $O_3$, $O_2$ plasma, $N_2$ plasma, $NH_3$ plasma or a combination thereof. Alternatively, a secondary thermal process may be performed on the structure illustrated in FIG. 12 at a temperature in the range of about 800° C.-about 1000° C. in an atmosphere of $O_2$, $N_2O$, $NH_3$, $H_2O$, $H_2$ or a combination thereof. According to example embodiments, the primary thermal process and the secondary thermal process may both be performed on the structure illustrated in FIG. 12. Each of the primary thermal process and the secondary thermal process may be performed using a furnace process or an RTP.

Figure 13A:
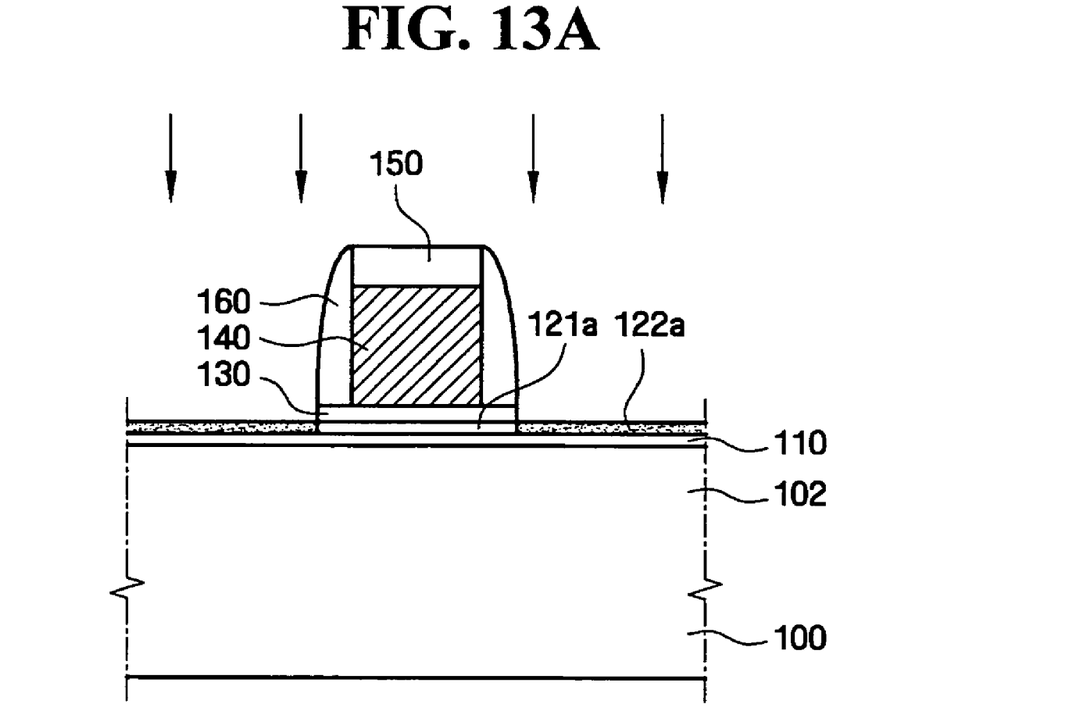

As a result of the thermal processing of the structure, as illustrated in FIG. 13A, charge-trap-site elimination elements, for example, oxygen, nitrogen, and/or hydrogen, may be injected into the exposed portions of the charge-trap insulation layer 120a. The charge-trap-site elimination elements injected into the charge-trap insulation layer 120a may combine with charge-trap sites present in the charge-trap insulation layer 120a, thereby reducing the number of charge-trap sites in the charge-trap insulation layer 120a. As a result, the exposed portions of the charge-trap insulation layer 120a may be transformed into second regions 122a which have a relatively low density of charge-trap sites, and the remaining non-exposed portion of the charge-trap insulation layer 120a that is covered by the blocking layer 130, and may thus avoid the injection of the charge-trap-site elimination elements into a first region 121a. The boundaries between the first region 121a and the second regions 122a may be aligned with the outer sidewalls of the spacers 160 (or the sidewalls of the blocking layer 130), as illustrated in FIG. 13A.

Figure 13B:
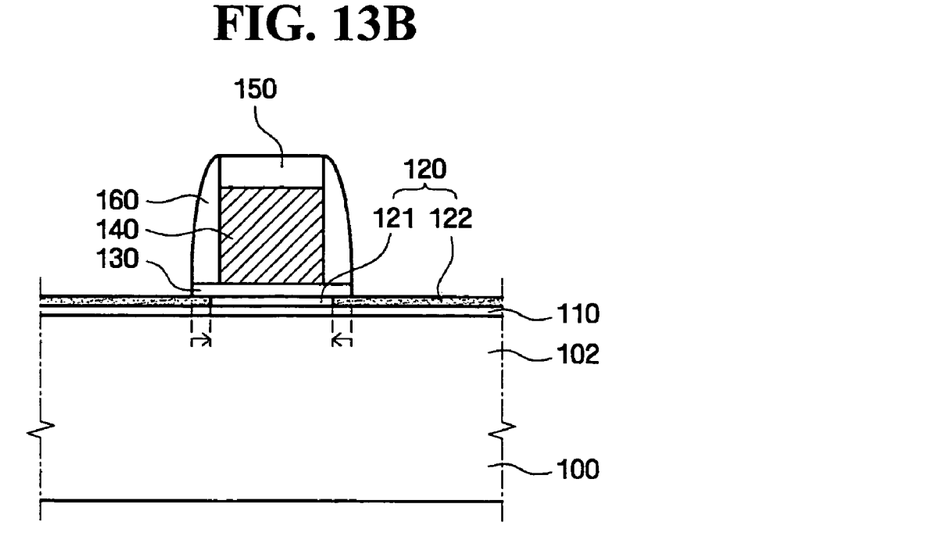

Referring to FIG. 13B, the charge-trap-site elimination elements may diffuse toward the first region 121 during a predetermined or given amount of time after the injection of the charge-trap-site elimination elements into the charge-trap insulation layer 120a. The diffusion of the charge-trap-site elimination elements may be expedited because of the above-described primary and secondary thermal processes. In order to further expedite the diffusion of the charge-trap-site elimination elements, an additional thermal process may be performed at a temperature in the range of about 800° C.-about 1100° C. in an inert gas atmosphere or vacuum atmosphere after the primary and secondary thermal processes. However, an additional thermal process may further be performed. The diffusion of the charge-trap-site elimination elements may be caused by an additional thermal process that may be performed later in the fabrication of a nonvolatile memory device.

As the charge-trap-site elimination elements diffuse into the first region 121a, the combined area of the second regions 122a may increase, and the area of the first region 121a may decrease. As a result of the diffusion of the charge-trap-site elimination elements, the formation of a first region 121 and second regions 122 may be completed, as illustrated in FIG. 13B. The boundaries between the first region 121 and the second regions 122, which are completed by diffusion, may be closer to the central axis AX of the gate electrode 140 than the boundaries between the first region 121a and the second regions 122a which are injected right after. Referring to FIGS. 13A and 13B, the second regions 122a may extend into the first region 121a so that the boundaries between the first region 121 and the second regions 122 may be disposed between the outer sidewalls of the spacers 160 and the sidewalls of the gate electrode 140. However, example embodiments may not be restricted to this. The degree to which the second regions 122a extend into the first region 122a may be controlled by adjusting the temperatures and the durations of the primary and secondary thermal processes or varying the types of charge-trap-site elimination elements.

Thereafter, source/drain regions 102 may be formed by implanting impurity ions into the semiconductor substrate 100. As a result, the formation of the nonvolatile memory device 10 illustrated in FIG. 1 may be completed. The formation of the source/drain regions 102 may be performed earlier than set forth herein. The nonvolatile memory devices 11-16 illustrated in FIGS. 3-8, respectively, may be fabricated using almost the same method as example embodiments illustrated in FIGS. 9-13B.

Specifically, in order to fabricate the nonvolatile memory device 11 illustrated in FIG. 3, the blocking layer 130 may be formed, as illustrated in FIG. 12, and then, the blocking layer 130 may be recessed inside of the outer sidewalls of the spacers 160, thereby obtaining the blocking layer 130_1 illustrated in FIG. 3. The blocking layer 130_1 may be obtained by performing an isotropic etching operation, e.g., wet etching. During the isotropic etching operation, an etchant having increased etch selectivity of the blocking layer 130 to other layers may be used.

Because the blocking layer 130_1 is recessed inside of the outer sidewalls of the spacers 160, the area of the charge-trap insulation layer 120 exposed by the blocking layer 130_1 may be larger than the area of the charge-trap insulation layer 120 exposed by the blocking layer 130, thereby increasing the area of the second regions 122 formed by the injection. As a result, the boundaries between the first region 121 and the second regions 122 may become even closer to the central axis AX of the gate electrode 140. In order to fabricate the nonvolatile memory device 12 illustrated in FIG. 4, portions of the charge-trap insulation layer 120 that remain exposed even after the patterning of the blocking layer 130 may be etched. In order to sufficiently expose the charge-trap insulation layer 120, the blocking layer 130 may be recessed, as performed in example embodiments illustrated in FIG. 3.

In order to fabricate the nonvolatile memory device 13 illustrated in FIG. 5, portions of the charge-trap insulation layer 120 that remain exposed even after the patterning of the blocking layer 130 may be etched. Thereafter, the charge-trap insulation layer 120 may be recessed inwardly by an isotropic etching operation, for example, wet etching, thereby obtaining a charge-trap insulation layer 121. During the isotropic etching operation, an etchant having a higher etch selectivity of the charge-trap insulation layer 120 compared to other layers may be used. Alternatively, the charge-trap layer 121 may be obtained by etching the portions of the charge-trap insulation layer 120 that remain exposed even after the patterning of the blocking layer 130 using an isotropic etching method without the need to perform an additional recess operation. The nonvolatile memory device 13 illustrated in FIG. 5 may have no second regions 122, and, thus, the operations illustrated in FIGS. 13A and 13B may not be necessary for the fabrication of the nonvolatile memory device 13.

In order to fabricate the nonvolatile memory device 14 illustrated in FIG. 6 or the nonvolatile memory device 15 illustrated in FIG. 7, modifications may be made to the operations illustrated in FIG. 11. Specifically, in order to fabricate the nonvolatile memory device 14, a first spacer insulation layer and a second spacer insulation layer may be sequentially deposited and then etched-back, thereby forming the first spacers 161 and the second spacers 162. In order to fabricate the nonvolatile memory device 15 illustrated in FIG. 7, a first spacer insulation layer may be deposited and then etched-back, thereby forming the first spacers 161_1. Thereafter, a second spacer insulation layer may be deposited and then etched-back, thereby forming the second spacers 162_1.

In order to fabricate the nonvolatile memory device 16 illustrated in FIG. 8, the semiconductor substrate 100 may be divided into the memory cell region MCR and the peripheral circuit region PERI. Thereafter, the formation of structures in the memory cell region MCR may be performed using substantially the same method used to fabricate the nonvolatile memory device 15 illustrated in FIG. 7. The formation of structures in the peripheral circuit region PERI may be performed either in connection with or separately from the formation of respective corresponding structures in the memory cell region MCR. The types of structures that may be simultaneously formed in the peripheral circuit region PERI and the memory cell region MCR, respectively, may vary according to the type and characteristics of transistors to be fabricated.

For example, spacers may be simultaneously formed in the memory cell region MCR and the peripheral circuit region PERI, respectively. For example, the first spacers 261 may be formed in the peripheral circuit region PERI during the formation of the first spacers 161_1 in the memory cell region MCR. Thereafter, a second spacer insulation layer may be formed in the peripheral circuit region PERI and the memory cell region MCR, respectively. Thereafter, the second spacers 162_1 may be formed in the memory cell region MCR by performing an etch-back operation on the second spacer insulation layer in the memory cell region MCR. The second spacer insulation layer in the peripheral circuit region PERI may be protected by photoresist during the formation of the second spacers 162_1 in the memory cell region MCR. The second spacer insulation layer in the peripheral circuit region PERI may become the cover layer 262.

Figure 14:
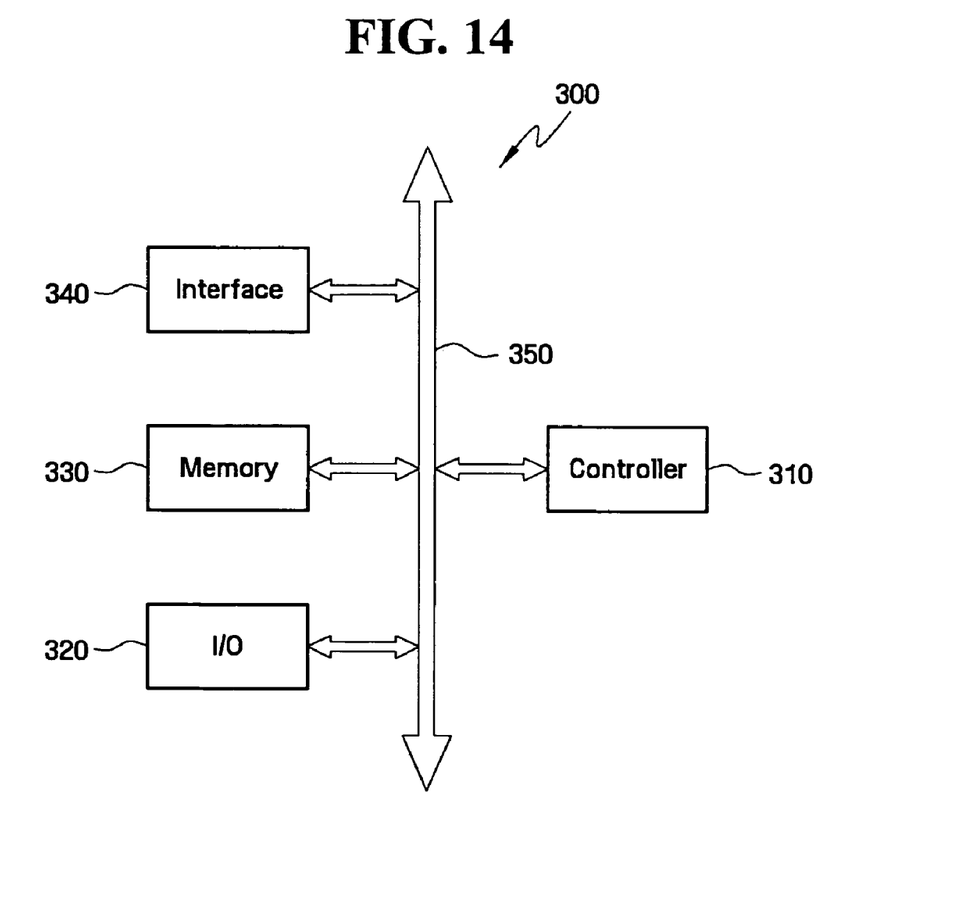
FIG. 14 is a schematic diagram of a memory system according to example embodiments.

The nonvolatile memory devices 10-16 of FIGS. 1-13B may be used as NAND nonvolatile memory devices or NOR nonvolatile memory devices. In addition, the nonvolatile memory devices 10-16 of FIGS. 1-13B may be applied to various memory systems. FIG. 14 is a schematic diagram of a memory system 300 to which a nonvolatile memory device according to example embodiments may be applied.

Referring to FIG. 14, the memory system 300 may be applied to a mobile system, e.g., a personal digital assistant (PDA), a portable computer, a web tablet, a wireless phone, a mobile phone, a digital music player, a memory card and/or a system for transmitting and/or receiving information. The memory system 300 may include a controller 310, an input/output (I/O) device 320, e.g., a keypad, a keyboard and/or a display, a memory 330, an interface 340, and a bus 350. The memory 330 and the interface 340 may be connected to each other via the bus 350.

The controller 310 may include one or more microprocessors, digital signal processors, microcontrollers, or other similar processing devices. The memory 330 may be used to store a command executed by the controller 310. The memory 330 may include a nonvolatile memory device according to example embodiments. The interface 340 may transmit data to or receive data from a communication network.

According to example embodiments, prevention or reduction of the deterioration of the device characteristics of a nonvolatile memory device regardless of threshold voltage variations, and prevention or reduction of the deterioration of a breakdown voltage by preventing or reducing the lateral spread of charges, may be possible.

While example embodiments have been particularly shown and described with reference to example embodiments thereof, it will be understood by those of ordinary skill in the art that various changes in form and details may be made therein without departing from the spirit and scope of the following claims.

What is claimed is:

1. A nonvolatile memory device comprising:
   a semiconductor substrate having a source region and a drain region;
   a charge-trap insulation layer on the semiconductor substrate and including a first region and second regions having charge-trap sites with a lower density than the first region; and
   a gate electrode on the charge-trap insulation layer,
   wherein the first region is overlapped by the gate electrode and the second regions are outside of the first region, and
   wherein the second regions overlap at least a portion of the source region and the drain region.

2. The nonvolatile memory device of claim 1, wherein:
   the first region includes a central axis of the gate electrode, and is overlapped by the gate electrode; and
   boundaries between the first region and the second regions are apart from the central axis of the gate electrode.

3. The nonvolatile memory device of claim 2, wherein:
   the charge-trap insulation layer includes silicon (Si) and nitrogen (N); and
   the silicon content of the first region is greater than the silicon content of the second regions.

4. The nonvolatile memory device of claim 3, wherein:
   the charge-trap insulation layer further includes oxygen (O) or hydrogen (H); and
   the oxygen or hydrogen content of the first region is zero or smaller than the oxygen or hydrogen content of the second regions.

5. The nonvolatile memory device of claim 2, further comprising:
   a blocking layer between the charge-trap insulation layer and the gate electrode and whose sidewalls protrude beyond sidewalls of the gate electrode.

6. The nonvolatile memory device of claim 5, wherein the boundaries between the first region and the second regions are inside of the sidewalls of the blocking layer.

7. The nonvolatile memory device of claim 5, further comprising:
   spacers on the sidewalls of the gate electrode, wherein the boundaries between the first region and the second regions are inside of outer sidewalls of the spacers.

8. The nonvolatile memory device of claim 7, wherein the sidewalls of the blocking layer are aligned with the outer sidewalls of the spacers or inside of the outer sidewalls of the spacers.

9. The nonvolatile memory device of claim 7, wherein the charge-trap insulation layer is patterned so that outer sidewalls of the second regions are aligned with the outer sidewalls of the spacers.

10. The nonvolatile memory device of claim 1, further comprising:

a memory cell region including the charge-trap insulation layer; and a peripheral circuit region including a gate insulation layer and a second gate electrode on the gate insulation layer.

11. A nonvolatile memory device comprising:
a semiconductor substrate;
a charge-trap insulation layer on the semiconductor substrate;
a blocking layer on the charge-trap insulation layer; and
a gate electrode on the blocking layer,
wherein sidewalls of the blocking layer protrude beyond sidewalls of the gate electrode, and sidewalls of the charge-trap insulation layer are between the sidewalls of the blocking layer and the sidewalls of the gate electrode.

12. The nonvolatile memory device of claim 11, further comprising:
spacers on the sidewalls of the gate electrode, wherein the sidewalls of the blocking layer are aligned with outer sidewalls of the spacers or between the sidewalls of the gate electrode and the sidewalls of the blocking layer.

13. The nonvolatile memory device of claim 11, further comprising:
a memory cell region including the charge-trap insulation layer; and
a peripheral circuit region including a gate insulation layer and a second gate electrode on the gate insulation layer.

14. A method of fabricating a nonvolatile memory device comprising:
forming a charge-trap insulation layer on a semiconductor substrate having a source region and a drain region, the charge-trap insulation layer including a first region and second regions having a lower density of charge- trap sites than the first region; and
forming a gate electrode on the charge-trap insulation layer,
wherein forming the charge-trap insulation layer includes overlapping the first region with the gate electrode, forming the second regions outside of the first region, and overlapping the second regions with at least a portion of the source region and the drain region.

15. The method of claim 14, wherein forming the charge-trap insulation layer includes forming the gate electrode with a central axis and overlapping the first region, wherein boundaries between the first region and the second regions are separate from the central axis of the gate electrode.

16. The method of claim 15, further comprising:
forming a blocking layer between the charge-trap insulation layer and the gate electrode, wherein the sidewalls of the blocking layer protrude beyond sidewalls of the gate electrode.

17. The method of claim 15, wherein:
the charge-trap insulation layer includes silicon (Si) and nitrogen (N); and
the silicon content of the first region is greater than the silicon content of the second regions.

18. The method of claim 17, wherein:
the charge-trap insulation layer further includes oxygen (O) or hydrogen (H); and
the oxygen or hydrogen content of the first region is zero or less than the oxygen or hydrogen content of the second regions.

19. The method of claim 14, wherein the semiconductor substrate is divided into a memory cell region including the charge-trap insulation layer; and a peripheral circuit region including a gate insulation layer and another gate electrode on the gate insulation layer.

20. A method of fabricating a nonvolatile memory device comprising:
forming a charge-trap insulation layer and a blocking insulation layer on a semiconductor substrate;
forming a gate electrode on the blocking insulation layer;
forming spacers on sidewalls of the gate electrode;
exposing a portion of the charge-trap insulation layer by etching the blocking insulation layer using the gate electrode and the spacers as etching masks; and
providing charge-trap-site elimination elements to the exposed portion of the charge-trap insulation layer.

21. The method of claim 20, wherein providing the charge-trap-site elimination elements includes performing a primary thermal process on the semiconductor substrate at a temperature in the range of about 300° C. - about 800° C. in an atmosphere of $O_3$, $O_2$ plasma, $N_2$ plasma, $NH_3$ plasma, or a combination thereof, performing a secondary thermal process on the semiconductor substrate at a temperature in the range of about 800° C. - about 1000° C. in an atmosphere of $O_2$, $N_2O$, $NH_3$, $H_2O$, $H_2$ or a combination thereof, or performing both the primary and secondary thermal processes.

22. The method of claim 21, further comprising:
performing a thermal process at a temperature in the range of about 800° C. - about 1100° C. in an inert gas atmosphere or vacuum atmosphere.

23. The method of claim 20, further comprising:
recessing the blocking layer before providing the charge-trap-site elimination elements.

24. The method of claim 20, further comprising:
etching the charge-trap insulation layer using the gate electrode and the spacers as etching masks, before providing the charge-trap-site elimination elements.

25. The method of claim 20, wherein the semiconductor substrate is divided into a memory cell region including the charge-trap insulation layer; and a peripheral circuit region including a gate insulation layer and another gate electrode on the gate insulation layer.

* * * * *